(12) United States Patent
Yang

(10) Patent No.: US 10,109,678 B2
(45) Date of Patent: Oct. 23, 2018

(54) INTEGRATED CIRCUIT SYSTEM WITH MEMORY SUPPORT AND METHOD OF MANUFACTURE THEREOF

(71) Applicant: Synopsys, Inc., Mountain View, CA (US)

(72) Inventor: Chung-Heng Yang, Zhubei (TW)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 15/425,835

(22) Filed: Feb. 6, 2017

(65) Prior Publication Data

US 2017/0236870 A1    Aug. 17, 2017

Related U.S. Application Data

(60) Provisional application No. 62/291,481, filed on Feb. 4, 2016.

(51) Int. Cl.
| | |
|---|---|
| *H01L 21/20* | (2006.01) |
| *H01L 27/24* | (2006.01) |
| *H01L 45/00* | (2006.01) |
| *G06F 17/50* | (2006.01) |

(52) U.S. Cl.
CPC ...... *H01L 27/2463* (2013.01); *G06F 17/5009* (2013.01); *G06F 17/5045* (2013.01); *H01L 45/08* (2013.01); *H01L 45/1233* (2013.01); *H01L 45/1675* (2013.01)

(58) Field of Classification Search
CPC ........................ H01C 7/00; H01F 2017/0086
See application file for complete search history.

(56) References Cited

U.S. PATENT DOCUMENTS

| | | | |
|---|---|---|---|
| 2010/0193761 A1* | 8/2010 | Amin | H01L 45/085 257/4 |
| 2016/0079527 A1* | 3/2016 | Fest | H01L 45/085 438/382 |

* cited by examiner

*Primary Examiner* — Julio J Maldonado
*Assistant Examiner* — Andre' C Stevenson
(74) *Attorney, Agent, or Firm* — Alston & Bird LLP

(57) ABSTRACT

A method of manufacturing an integrated circuit system, includes, in part, providing a planar surface on an insulator, forming first and second bottom electrodes over the insulator substrate, forming a first electrolyte over the first and second bottom electrodes, forming a first top electrode over the first electrolyte, forming and depositing a second bottom electrode over the insulator substrate, patterning and removing the first top electrode and the first electrolyte from regions above the second bottom electrode, forming a second electrolyte above the second bottom electrode and the first tope electrode, forming a second top electrode above the second electrolyte, and patterning and removing the second top electrode and the second electrolyte from regions above the first bottom electrode.

18 Claims, 23 Drawing Sheets

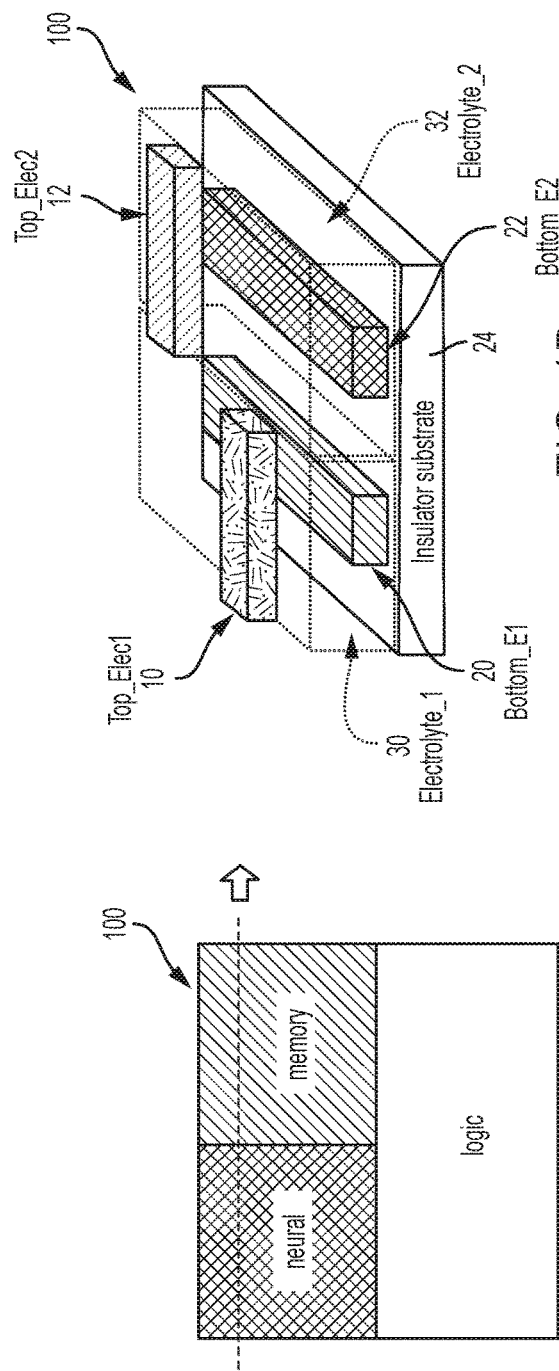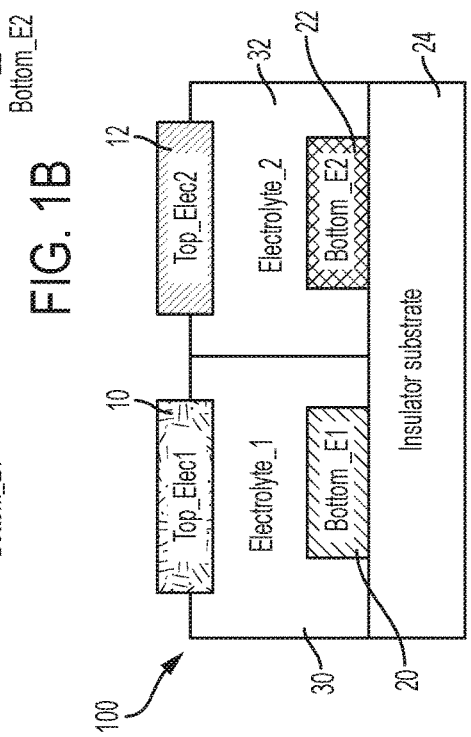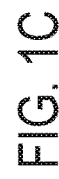

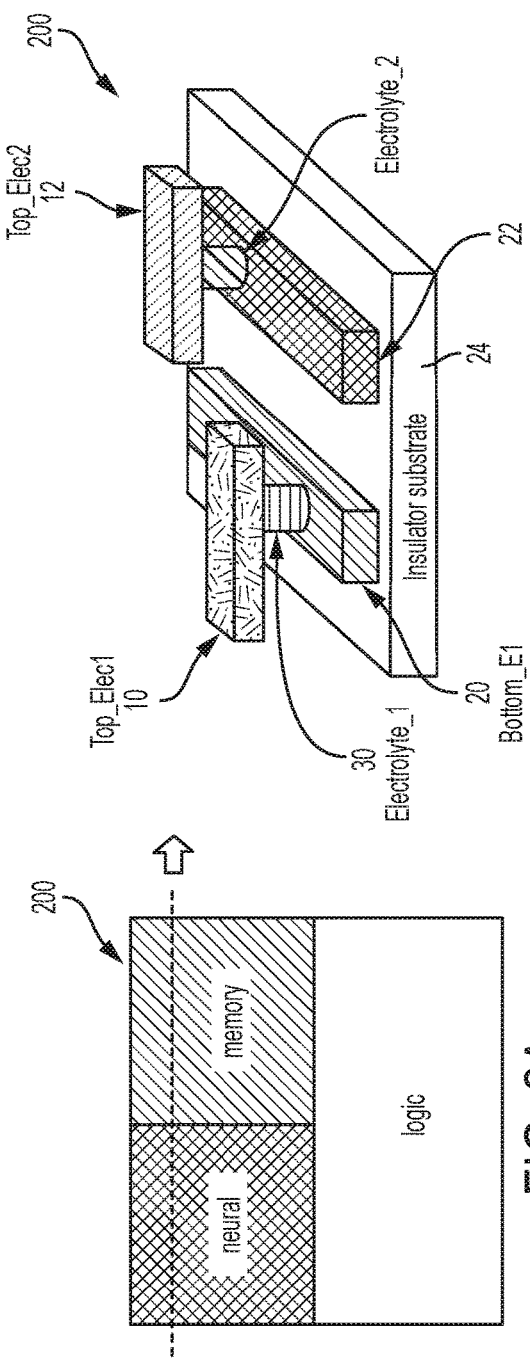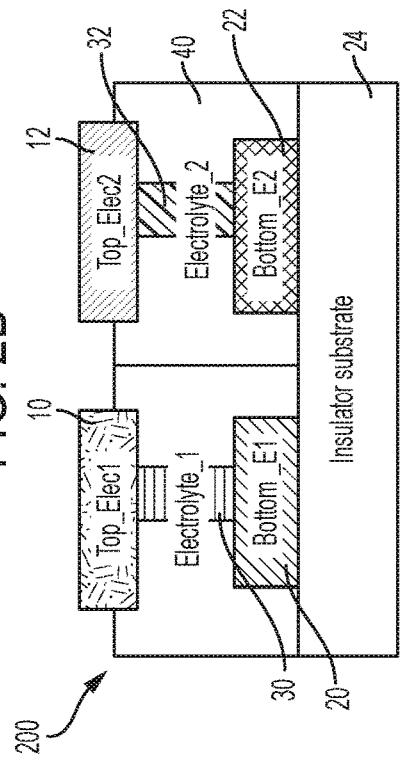
FIG. 2A
FIG. 2B
FIG. 2C

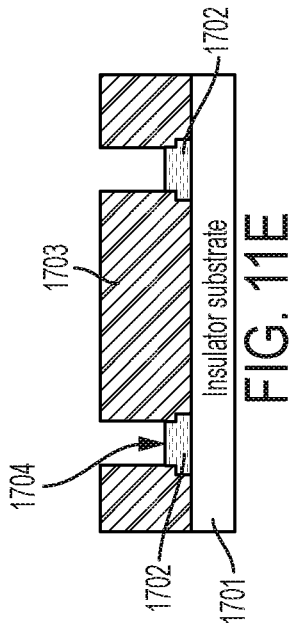
FIG. 11A
FIG. 11B
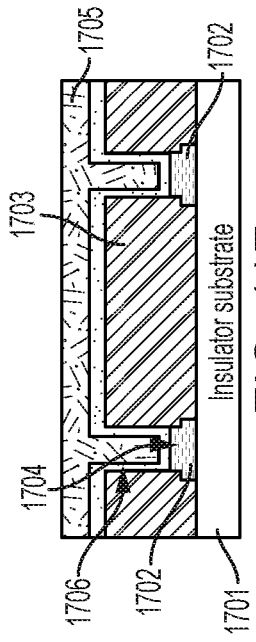
FIG. 11C
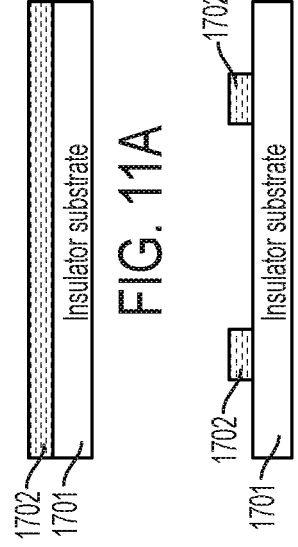
FIG. 11D
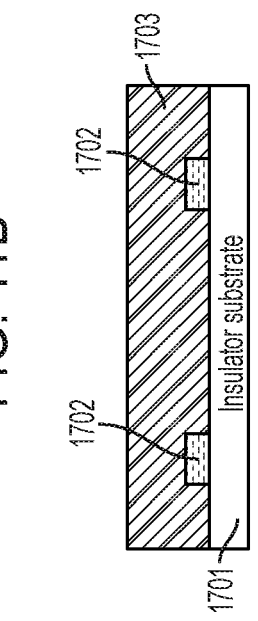
FIG. 11E
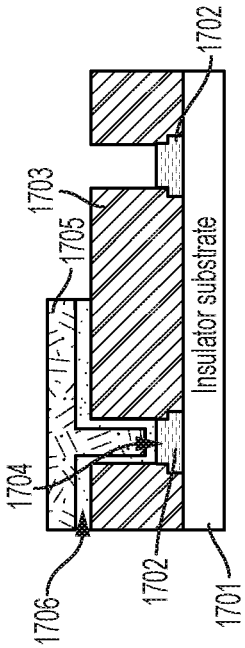
FIG. 11F
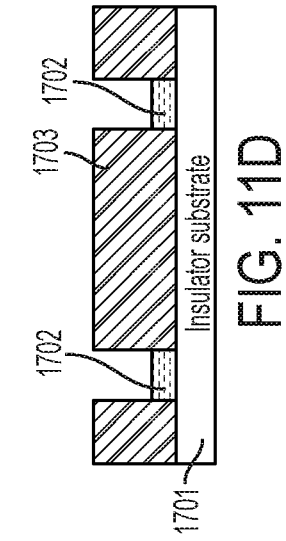
FIG. 11G

INTEGRATED CIRCUIT SYSTEM WITH MEMORY SUPPORT AND METHOD OF MANUFACTURE THEREOF

CROSS REFERENCE TO RELATED APPLICATIONS

The present application claims benefit under 35 USC 119(e) of U.S. Provisional Application Ser. No. 62/291,481, entitled "INTEGRATED CIRCUIT SYSTEM WITH MEMORY SUPPORT AND METHOD OF MANUFACTURE THEREOF," filed Feb. 4, 2016, the content of which is incorporated herein by reference in its entirety.

TECHNICAL FIELD

The present disclosure relates to manufacturing of semiconductor devices, and more particularly to a manufacturing process for integrating multiple memories and devices in an integrated circuit.

BACKGROUND

Semiconductor manufacturing processes and devices continue to advance. The packaging industry continues to develop more advanced packaging technologies capable of housing multiple devices in a single package. As package suppliers develop new techniques to hold more integrated circuits in a single package, problems related to power distribution and heat mitigation have come to the fore. System developers continue to look for higher density memory devices that can increase capacity and reduce power consumption. A need continues to exist for an integrated circuit system with higher degree of memory integration and support circuitry.

SUMMARY

A method of manufacturing an integrated circuit system, in accordance with one embodiment of the present invention, includes, in part, providing a planar surface on an insulator, forming first and second bottom electrodes over the insulator substrate, forming a first electrolyte over the first and second bottom electrodes, forming a first top electrode over the first electrolyte, forming an depositing a second bottom electrode over the insulator substrate, patterning and removing the first top electrode and the first electrolyte from regions above the second bottom electrode, forming a second electrolyte above the second bottom electrode and the first tope electrode, forming a second top electrode above the second electrolyte, and patterning and removing the second top electrode and the second electrolyte from regions above the first bottom electrode.

In one embodiment, the insulator is an oxide or nitride. In one embodiment, the first electrolyte is different from the second electrolyte. In one embodiment, the first electrolyte has a thickness that is different from a thickness of the second electrolyte. In one embodiment the first electrolyte is doped with a first dopant different than a second dopant doping the second electrolyte. In one embodiment, the first and second electrolytes have different doping concentrations. In one embodiment, the first top electrode is formed using a first material and the second top electrode is formed using a second material different from the first material.

In one embodiment, the first top electrode includes a plurality of layers formed from different materials. In one embodiment, the first and second top electrodes have different thicknesses. In one embodiment, the first bottom electrode is formed using a first material and said second bottom electrode is formed using a second material different from the first material.

In one embodiment, the first and second top electrodes are doped with different dopants. In one embodiment, the first and second top electrodes have different doping concentrations. In one embodiment, the first and second bottom electrodes are doped with different dopants. In one embodiment, the first and second top electrodes have different doping concentrations. In one embodiment, the first and second top electrodes have different thicknesses. In one embodiment, the first and second bottom electrodes have different thicknesses. In one embodiment, the first electrolyte includes a first doped region and a second undoped region. In one embodiment, the second electrolyte includes a first doped region and a second undoped region.

A method of manufacturing an integrated circuit system, in accordance with one embodiment of the present invention, includes, in part, providing a planar surface on an insulator substrate, forming first and second bottom electrodes over the insulator substrate, depositing an insulating layer over the first and second bottom electrodes, removing the insulating layer from regions positioned above the first and second bottom electrodes so as to expose the first and second bottom electrodes, depositing a first electrolyte over the first and second bottom electrodes, depositing a first top electrode above the first electrolyte, removing the first electrolyte and the first top electrode from above the second bottom electrode and from a portion of the insulating layer, depositing a second electrolyte over a remaining portion of the first top electrode and the second bottom electrode, depositing a second top electrode over the second electrolyte, removing the first second electrolyte and the second top electrode from above the first top electrode, and patterning and etching the second electrolyte and the second top electrode above the first bottom electrode.

An electronic design automation (EDA) tool, in accordance with one embodiment of the present invention is adapted to generate data associated with a layout and a mask set of an integrated circuit system, the data causing a planar surface to be provided on an insulator substrate, first and second bottom electrodes to be formed over the insulator substrate, a first electrolyte to be formed over the first and second bottom electrodes, a first top electrode to be formed over the first electrolyte, a second bottom electrode to be deposited over the insulator substrate, the first top electrode and the first electrolyte to be patterned and removed from regions above the second bottom electrode, a second electrolyte to be formed above the second bottom electrode and the first tope electrode, a second top electrode to be formed above the second electrolyte, and the second top electrode and the second electrolyte to be removed from regions above the first bottom electrode.

An electronic design automation (EDA) tool, in accordance with one embodiment of the present invention is adapted to generate data associated with a layout and a mask set of an integrated circuit system, the data causing a planar surface to be formed on an insulator substrate, first and second bottom electrodes to be formed over the insulator substrate, an insulating layer to be deposited over the first and second bottom electrodes, the insulating layer to be removed from regions positioned above the first and second bottom electrodes so as to expose the first and second bottom electrodes, a first electrolyte to be formed over the first and second bottom electrodes, a first top electrode to be deposited above the first electrolyte, the first electrolyte and the first top electrode to be removed from above the second bottom electrode and from a portion of the insulating layer, a second electrolyte to be deposited over a remaining portion of the first top electrode and the second bottom electrode, a second top electrode to be deposited over the second electrolyte, the first second electrolyte and the second top electrode to be removed from above the first top electrode, and the second electrolyte and the second top electrode to be patterned and etched from above the first bottom electrode.

BRIEF DESCRIPTION OF THE DRAWINGS

FIG. 1A is a simplified high-level block diagram of an integrated circuit system that includes a memristor and support circuitry, in accordance with one exemplary embodiment of the present invention.

FIG. 1B is a cut away view of the memristor of FIG. 1A, in accordance with one exemplary embodiment of the present invention.

FIG. 1C is side view of the memristor of FIG. 1A, in accordance with one exemplary embodiment of the present invention.

FIG. 2A is a simplified high-level block diagram of an integrated circuit system that includes a memristor and support circuitry, in accordance with one exemplary embodiment of the present invention.

FIG. 2B is a cut away view of the simplified of FIG. 2A, in accordance with one exemplary embodiment of the present invention.

FIG. 2C is side view of the simplified of FIG. 2A, in accordance with one exemplary embodiment of the present invention.

FIGS. 11A-11K show various processing steps for forming a memristor, such as that shown in FIG. 9, and as used, for example, in neural network and the non-volatile memory applications, in accordance with another exemplary embodiment of the present invention.

DETAILED DESCRIPTION

Figure 3:
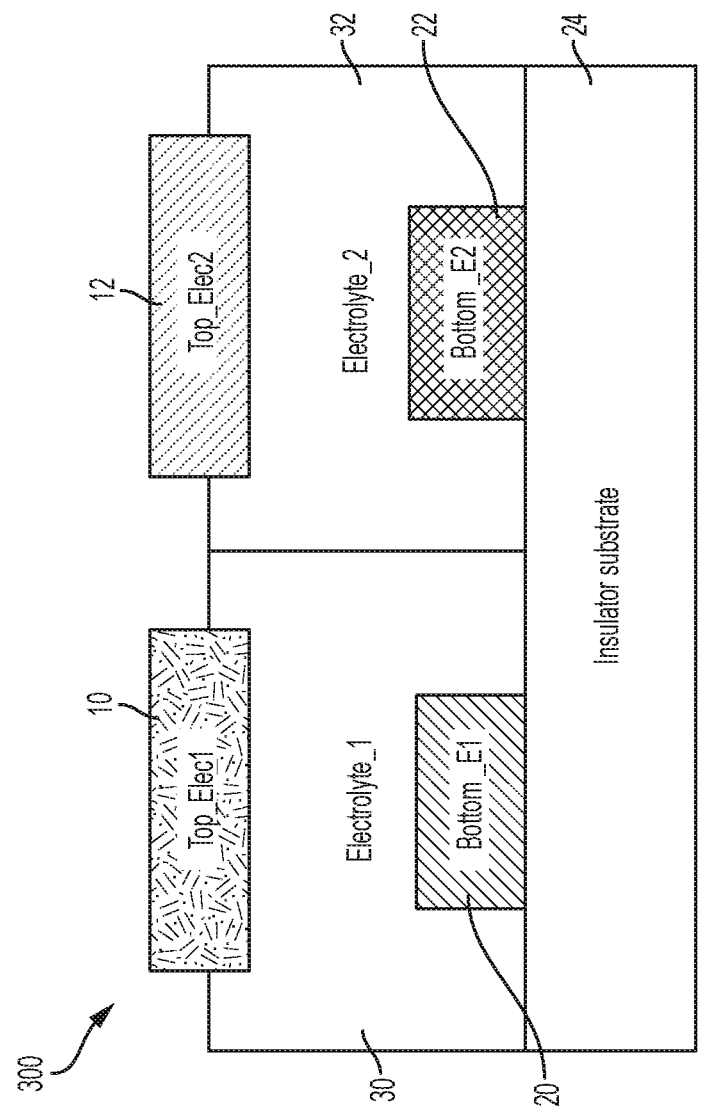
FIG. 3 is a side view of a memristor, in accordance with one exemplary embodiment of the present invention.

The following embodiments are described in detail to enable those skilled in the art to make and use various embodiments of the present invention. It is understood that other embodiments would be evident based on the present disclosure, and that system, process, or changes may be made without departing from the scope of the present invention.

In the following description, numerous specific details are given to provide a thorough understanding of the invention. However, it will be apparent that the invention may be practiced without these specific details. In order to increase clarity, some well-known circuits, system configurations, and process steps may not be described in detail.

The drawings showing embodiments of the present invention are semi-diagrammatic and not to scale and, particularly, some of the dimensions are for the clarity of presentation and are shown exaggerated in the drawing Figures.

The term "horizontal" as used herein is defined as a plane parallel to the plane or surface of the processed surface of the semiconductor wafer, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "processing" as used herein includes deposition of material or photoresist, patterning, implanting, exposure, development, etching, cleaning, and/or removal of the material or photoresist as required in forming a described structure.

As is known, an electrical current in a memristor can cause ion migration in solid electrolyte and change the resistivity of the solid electrolyte. This ion migration effect is too small to be found in previous large scale devices, however it is notable in nano-scale devices of certain materials. The memristor has been considered for use in, for example nonvolatile RAM (RRAM), neural networks, and logic functions.

Research of different solid electrolyte materials and different electrode materials for better performance in different applications is in its early stages. A low cost process flow to integrate different materials in forming a memristor is described hererin.

Integration of a memristor using different materials (or different layer thickness) on a die may be achieved economically. Low resolution mask steps can be used to define different materials on different areas. A single high resolution mask step can be used to define critical pattern for all memristor applications with different materials. This avoids additional high resolution mask steps as compared to the current single memristor process flow.

FIG. 1A is an exemplary high-level block diagram of an integrated circuit system 100 that integrates a memristor with memory support circuitry according to one embodiment of the present disclosure. The use of low resolution mask steps to define different materials on different areas and a single high resolution mask step to define critical pattern for all memristor applications without regard to the different materials is described herein.

The memristor disposed in integrated circuit system 100 of FIG. 1A, in accordance with embodiments of the present invention, may be used in neural network, non-volatile memory applications, Boolean logic functions, and the like.

FIG. 1B is a cutaway view of the memristor of integrated circuit system 100 of FIG. 1A showing the relationship between top electrodes Top_Elec1 10, Top_Elec2 12, bottom electrodes Bottom_E1 20, Bottom_E2 22, formed on insulator substrate 24. The first bottom electrode 20 is surrounded by a first electrolyte Electrolye_1 30, and the second bottom electrode 22 is surrounded by a second electrolyte Electrolye_2 32. Top electrode 10 is positioned above the first electrolyte 30 and top electrode 12 is positioned above the second electrolyte 32. The first electrolyte 30 separates the first bottom electrode 20 from the first top electrode 10. The second electrolyte 32 separates the second bottom electrode 22 from the second top electrode 12. It is understood that the overlap of the top electrodes 10, 12 and bottom electrodes 20, 22 is used to form a memristor between them.

The Top electrode may be Ti, TiN, Cu, Pt, ITO (Indium—Tin oxide), Gd doped ITO, and the like. The bottom electrode may be Al, TiN, Pt, Polysilicon, Amorphous silicon with Ta, and the like. The Electrolyte may be HfO2, Sios, Al2O3, diamond-like carbon (DLC). Table below list such combinations:

| Top Electrode | Electrolyte | Bottom Electrode |
| --- | --- | --- |
| Ti | HfO2 | Al |
| Ti | HfO2 | TiN |
| TiN | HfO2 | Pt |
| Cu | SiO2 | Pt |
| Cu | Al2O3 | Poly_Si or Amorphous_Si + Ta |
| Pt | DLC(diamond-like carbon) | TiN |
| IOT(indium-tin-oxide) | HfO2 | TiN |
| Gd:ITO(Gd doped ITO) | HfO2 | TiN |

FIG. 1C is a cross-section view of the memristor shown in FIG. 1B. The materials used in forming the top electrodes and the bottom electrodes may be different. Moreover, electrolytes 30 and 32 may be made from difference materials, may have different thicknesses, doped with different dopants, have different doping concentration, and the like.

FIG. 2A is an exemplary high-level block diagram of an integrated circuit system 200 that integrates a memristor with memory support circuitry in accordance with another embodiment of the present disclosure. As is seen from corresponding cutaway view of FIG. 2B and the corresponding cross-sectional view of FIG. 2C, integrated circuit system 200 is similar to integrated circuit system 200, except that in integrated circuit system 200, electrolyte 30 disposed between top electrode 10 and bottom electrode 20 does not encase bottom electrode 20; and electrolyte 32 disposed between top electrode 12 and bottom electrode 22 does not encase bottom electrode 22. As is seen from FIG. 2B, an insulator 40, such as Nitride or Oxide, surrounds top electrodes 10, 12, bottom electrodes 20, 22, and first and second electrolytes 30, 32. It is understood that the memristor is formed in the areas defined by the overlapping regions of the top and bottom electrodes.

FIG. 3 is a side view of a memristor 300 in accordance with one embodiment of the present invention. Memristor 300 is formed on planar insulator substrate 24 and is shown as including first and second top electrodes 10, 12, first and second bottom electrodes 20, 22, a first electrolyte 30 separating first top electrode 10 from first bottom electrode 20, and a second electrolyte 32 separating first top electrode 12 from first bottom electrode 22. It is understood that the embodiment shown in FIG. 3 may be formed on the planarized surface of an existing integrated circuit thus enabling on-chip integration of the memristor, for such applications as neural networks and non-volatile memory, while simplifying the interconnect between the integrated circuit and the memristor.

The top and bottom electrodes of the memristor may be formed from different materials, may have different thicknesses, and have other differences. It is understood that insulator substrate 24 may be planarized, may be part of an existing integrated circuit, or may be a stand-alone substrate. It is understood that it is not necessary to isolate the individual memristor cells in the un-doped electrolyte because the convergence of ions, to form conductive threads, is limited to the region between the top and bottom electrodes and cannot impact the adjacent cells.

Figure 4:
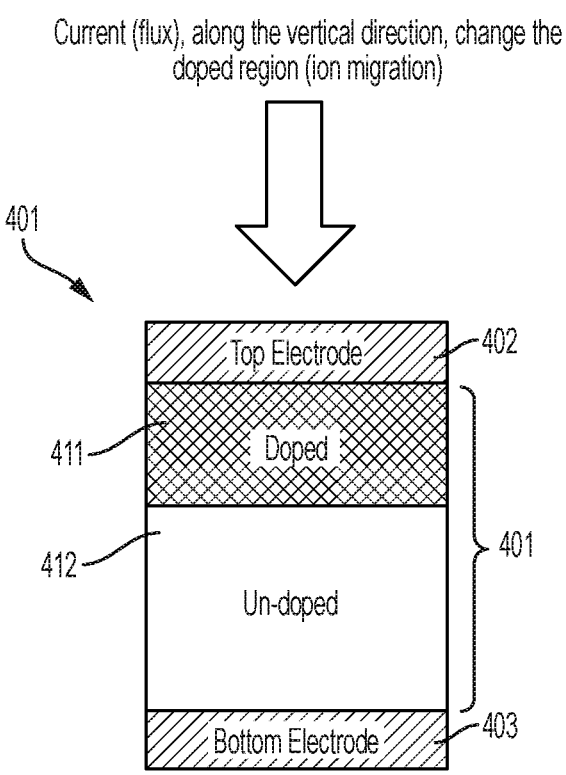
FIG. 4 is a side view of a memristor, in accordance with one exemplary embodiment of the present invention.

FIG. 4 is a cross-sectional view of a memristor 400, in accordance with another exemplary embodiment of the present disclosure. Memristor 400 is shown as including a top electrode 402, a bottom electrode 403, and an electrolyte region 401. Electrolyte region 401 is shown as including a first region 411 having a first doping concentration, and a second region 412 that is undoped. Although not shown, it is understood that implanted region 411 having the first doping concentration is disposed within an insulator, such as insulating region 40 shown in FIG. 2C, in order to prevent leakage or cross-talk between different memristor cells that may otherwise be caused by ion migration in the doped electrolyte region. Because the convergence of ions to form a conductive path is limited to the region between the top and bottom electrodes, undoped region 412 may or may not be disposed in an insulating region. In one exemplary embodiment, electrolyte 401 may have a thickness of 3 nm. Top electrode 402 and bottom electrode 403 may be formed using different materials and may have different thicknesses, geometry, a combination thereof, and the like.

Figure 5A:
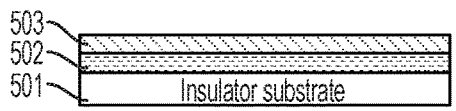
FIGS. 5A-5M show various processing steps for forming a memristor, such as that shown in FIG. 1C, as used, for example, in neural network and the non-volatile memory applications, in accordance with one exemplary embodiment of the present invention.

FIGS. 5A-5M show various processing steps for forming a memristor, such as that shown in FIG. 1C, as used, for example, in neural network and the non-volatile memory applications, in accordance with one exemplary embodiment of the present invention. A memristor used in Boolean Logic applications, may require multiple stacked levels of substantially similar structures. As shown in FIG. 5A, an insulating substrate 501 is used as the staring material. Thereafter, a first bottom electrode layer 502 is deposited on substrate 501 and an insulator layer 503 is deposited on bottom electrode layer 502.

Figure 5B:
Figure 5C:
Figure 5D:
Figure 5E:
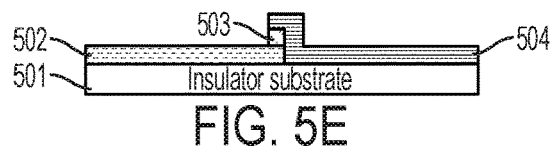
Figure 5F:
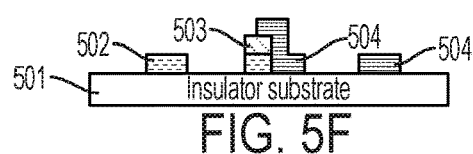

Next, layers 502 and 503 are patterned and etched using conventional processing steps, as shown in FIG. 5B. Next, as shown in FIG. 5C, a second bottom electrode 504 is deposited on the structure shown in FIG. 5B. Next, as shown in FIG. 5D, the second bottom electrode layer 504 is patterned and etched. Alternatively, as shown in FIG. 5E, both insulator layer 503 and second bottom electrode 504 are etched. Thereafter, as shown in FIG. 5F, layers 502, 503 and 54 are patterned and etched to form the device structure shown in FIG. 5F. Alternatively, the layers may be patterned and etched to form the device structures shown in FIG. 5G or 5H, in which first and second bottom electrodes are identified by reference numbers 502 and 504, respectively.

Figure 5G:
Figure 5H:
Figure 5I:

Next, as shown in FIG. 5I, a first solid electrolyte layer 505 is deposited on the structure shown in FIG. 5H, and a first top electrode layer 506 is deposited on the first solid electrolyte 505 to form the device structure shown in FIG. 5I.

Figure 5J:
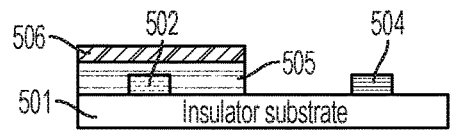
Figure 5K:
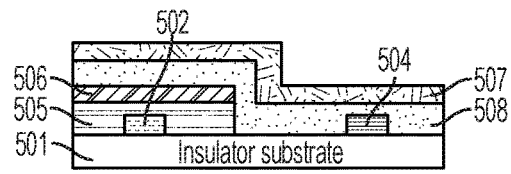
Figure 5L:
Figure 5M:
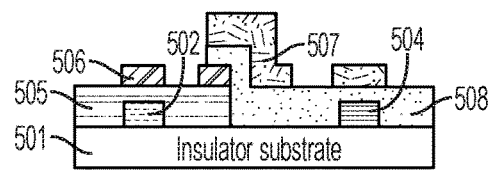

Thereafter, layers 505 and 506 are patterned and etched to from the device structure shown in FIG. 5J. Thereafter, as shown in FIG. 5K, a second solid electrolyte layer 508 is deposited on the device structure shown in FIG. 5J, and a second top electrode layer 507 is deposited on second solid electrolyte layer 508 to form the device structure shown in FIG. 5K. Next, as shown in FIG. 5L, layers 507 and 508 are etched to form the device structure shown in FIG. 5L. Next, as shown in FIG. 5M, the first top electrode layer 506 and the second top electrode 507 are etched to form the device structure shown in FIG. 5M. It is understood that the remaining portions of layers 504, 503 and 502 shown near the center of FIGS. 5F and 5G do not affect the function of the memristor and are mask options. It is also understood that if the first and second bottom electrodes are formed from the same material and have the same thickness, processing steps shown in FIGS. 5B, 5C, 5D and 5E may be skipped.

Figure 6:
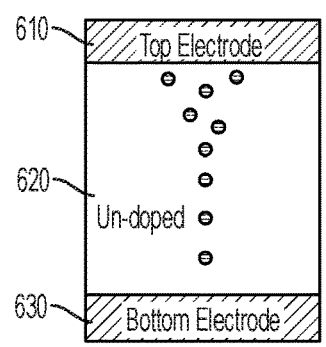
FIG. 6 is a simplified cross-sectional view of a memristor, in accordance with one embodiment of the present invention.

FIG. 6 is a simplified cross-sectional view of a memristor 600, in accordance with one embodiment of the present invention. Memristor 600 is shown as including a top electrode 610, a bottom electrode 630 and an electrolyte region 620 adapted to form a conductive path between the top and bottom electrodes. If an undoped electrolyte region 620 prevents leakage to and from neighboring memristors or other cells, no additional insulator may be required. When a voltage is applied between the top and bottom electrodes, ions in the electrolyte migrate from the top electrode to the bottom electrode to from a conductive path therebetween. A reverse voltage causes the conductive path to disappear.

Figure 7:
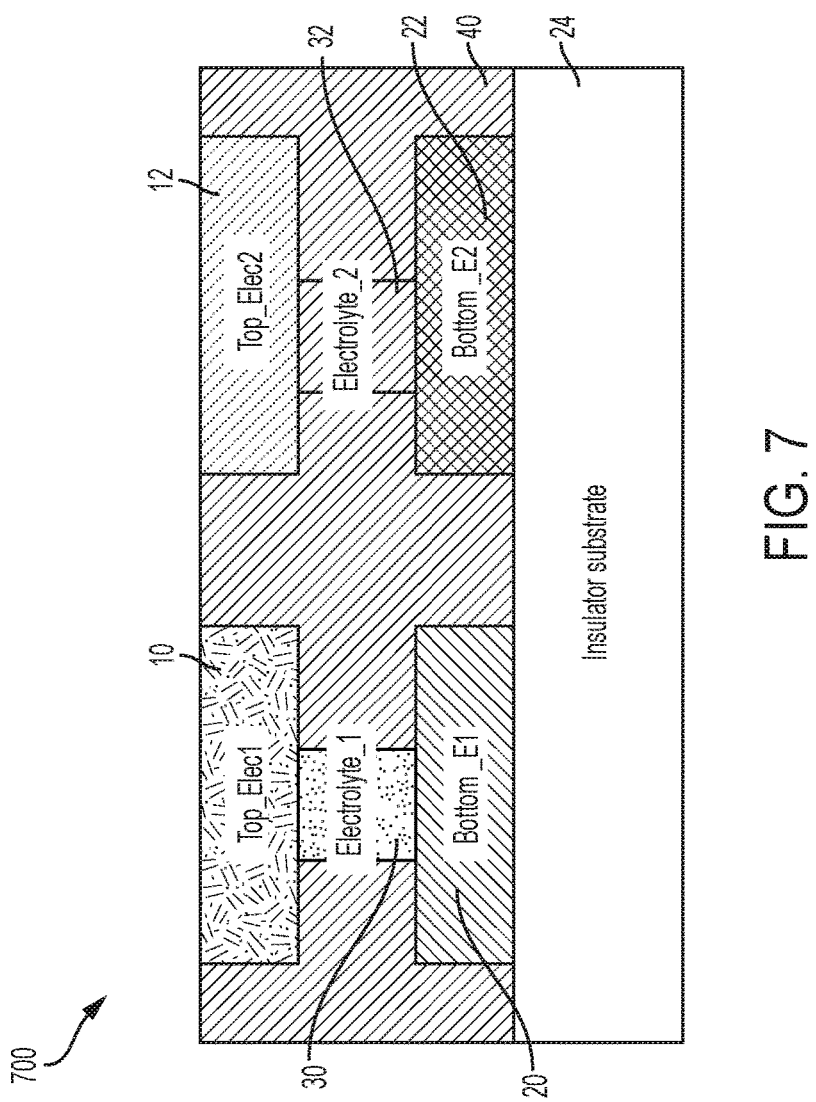
FIG. 7 is a simplified cross-sectional view of a memristor, in accordance with one embodiment of the present invention.

FIG. 7 is a side view of a memristor 700 in accordance with one embodiment of the present invention. Memristor 700 is formed on planar insulator substrate 24 and is shown as including first and second top electrodes 10, 12, first and second bottom electrodes 20, 22, a first electrolyte 30 separating first top electrode 10 from first bottom electrode 20, a second electrolyte 32 separating first top electrode 12 from first bottom electrode 22, and an insulator 40 encasing the electrolytes 30 and 32 and portions of the electrodes, as shown.

Figure 8A:
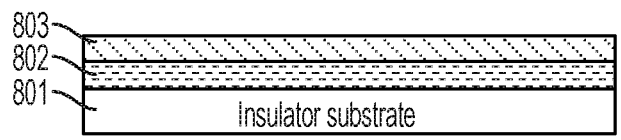
FIGS. 8A-8O show various processing steps for forming a memristor, such as that shown in FIG. 2C, as used, for example, in neural network and the non-volatile memory applications, in accordance with one exemplary embodiment of the present invention.
Figure 8B:
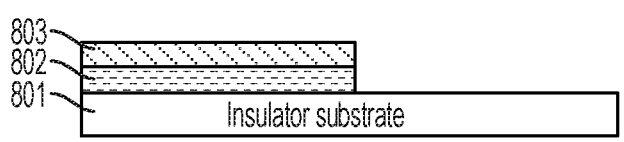
Figure 8C:
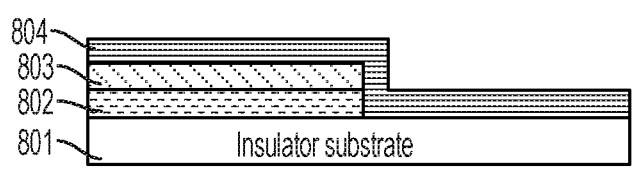
Figure 8D:
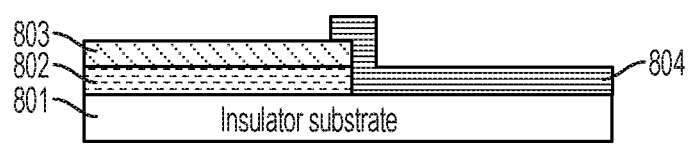
Figure 8E:
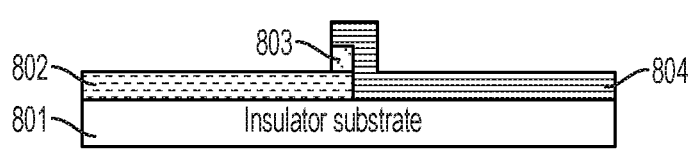
Figure 8F:
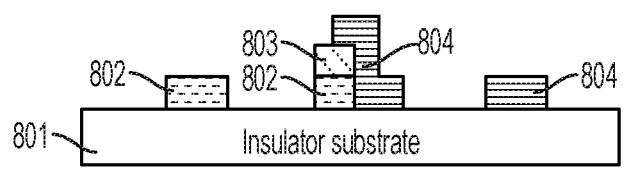
Figure 8G:
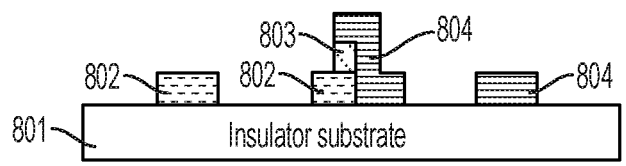
Figure 8H:
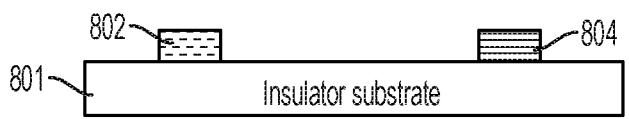
Figure 8I:
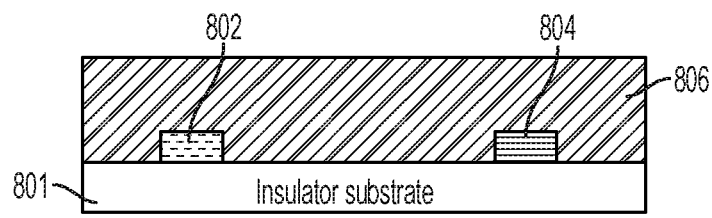
Figure 8J:
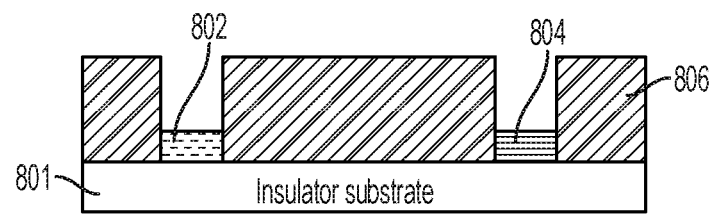
Figure 8K:
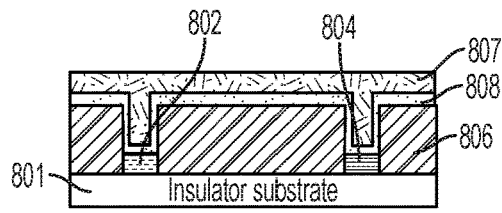
Figure 8L:
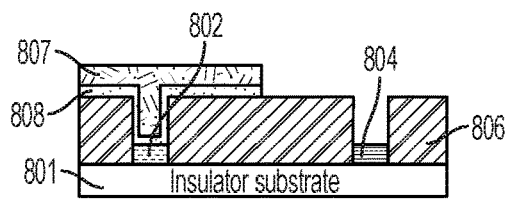
Figure 8M:
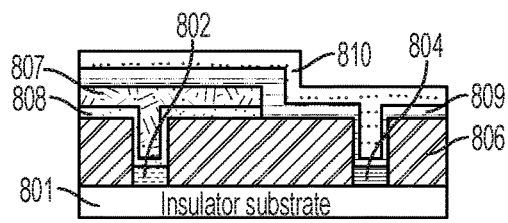
Figure 8N:
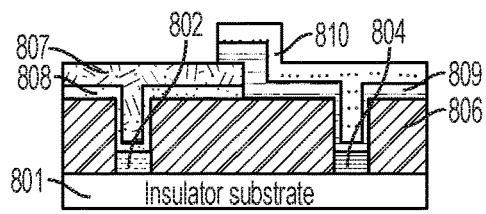
Figure 8O:
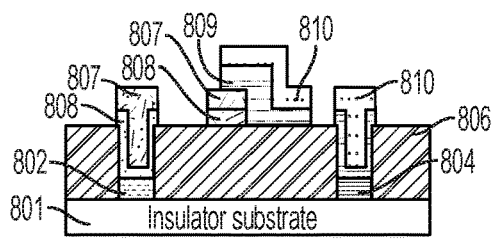

FIGS. 8A-8O show various processing steps for forming a memristor, such as that shown in FIG. 2C, as used, for example, in neural network and the non-volatile memory applications, in accordance with one exemplary embodiment of the present invention. As shown in FIG. 8A, an insulating substrate 801 is used as the staring material. Thereafter, a first bottom electrode layer 802 is deposited on substrate 801 and an insulator layer 803 is deposited on bottom electrode layer 802.

Next, layers 802 and 803 are patterned and etched using conventional processing steps to form the device structure shown in FIG. 8B. Next, as shown in FIG. 8C, a second bottom electrode 804 is deposited on the structure shown in FIG. 8B. Next, as shown in FIG. 8D, the second bottom electrode layer 804 is patterned and etched. Alternatively, as shown in FIG. 8E, both insulator layer 803 and second bottom electrode 804 are etched. Thereafter, as shown in FIG. 8F, layers 802, 803 and 804 are patterned and etched to form the device structure shown in FIG. 8F. Alternatively, the layers may be patterned and etched to form the device structures shown in FIG. 8G or 8H, in which first and second bottom electrodes are identified by reference numbers 802 and 504, respectively.

Thereafter, as shown in FIG. 8I, an insulating layer 806 is deposited on the device structure of FIG. 8H. Next, insulating layer 806 is patterned and etched above first and second bottom electrodes 802, 804 to form the device structure shown in FIG. 8J. Next, a first solid electrolyte layer 808 is deposited on the device structure shown in FIG. 8J subsequent to which a first top electrode 807 is deposited on the first solid electrolyte 808 to form the device structure shown in FIG. 8K. Thereafter, the first solid electrolyte 808 and the first top electrode 807 are patterned and etched to form the device structure shown in FIG. 8L.

Next, a second solid electrolyte 809 is deposited on the device structure of FIG. 8L, subsequent to which a second top electrode 810 is deposited on the second solid electrolyte 809 to form the device structure shown in FIG. 8M. Thereafter, the second solid electrolyte 809 and the second top electrode 810 are patterned and etched to form the device structure shown in FIG. 8N. Thereafter, first top electrode layer 807, second top electrode 810, first solid electrolyte layer 808, and second solid electrolyte layer 810 are patterned and etched to form the device structure shown in FIG. 8O. It is understood that if the first and second bottom electrodes are formed from the same material and have the same thickness, processing steps shown in FIGS. 8B, 8C, 8D and 8E may be skipped.

Figure 9:
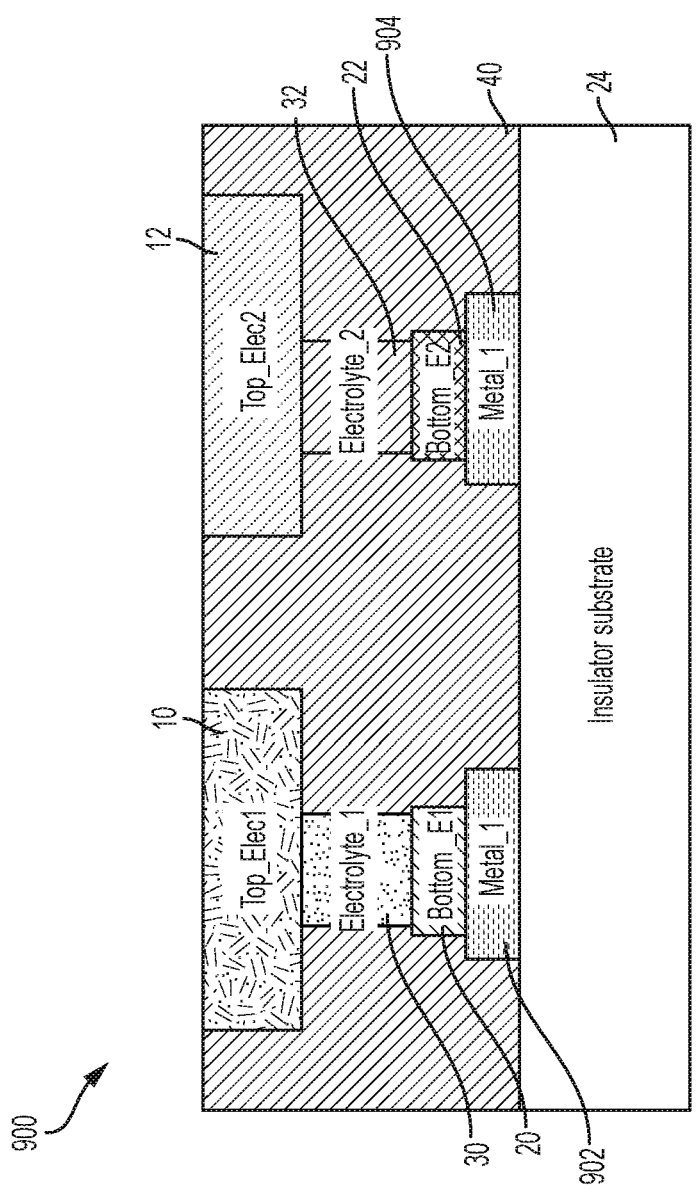
FIG. 9 is a simplified cross-sectional view of a memristor, in accordance with one embodiment of the present invention.

FIG. 9 is a simplified cross-sectional view of a memristor 900. Memristor 900 is similar to memristor 200 shown in FIG. 2C, except that memristor 900 includes a metal 902 positioned below bottom electrode 20, and a metal 904 positioned below bottom electrode 22. The metals are adapted to be a redistribution layer for providing access and controls to neural network, non-volatile memory, and other systems. Insulator 40 facilitates the use of known techniques to fabricate a top planar surface for fabricating additional layers above any neural network, non-volatile memory, or other devices.

Figure 10A:
FIGS. 10A-10L show various processing steps for forming a memristor, such as that shown in FIG. 9, and as used, for example, in neural network and the non-volatile memory applications, in accordance with one exemplary embodiment of the present invention.
Figure 10B:
Figure 10C:
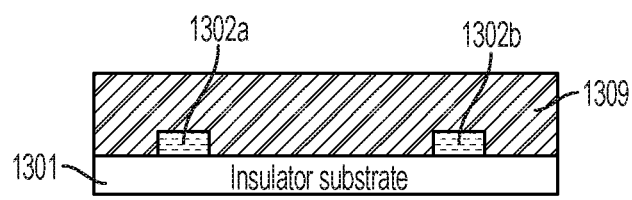
Figure 10D:
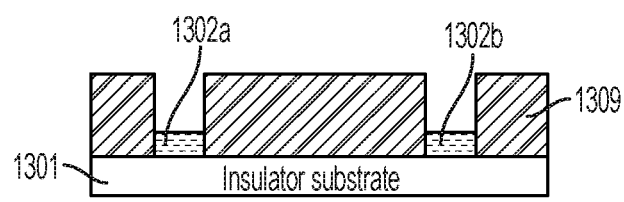
Figure 10E:
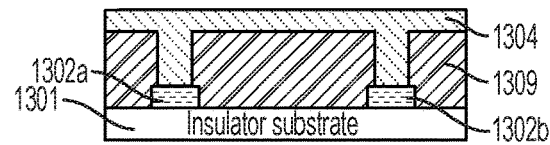

FIGS. 10A-10L show various processing steps for forming a memristor, such as that shown in FIG. 9, and as used, for example, in neural network and the non-volatile memory applications, in accordance with one exemplary embodiment of the present invention. An insulating substrate 1301 is used as the staring material. Thereafter, a first metal layer 1302 is deposited on substrate 1301, as shown in FIG. 10A. First metal layer 1302 is subsequently patterned and etched to form two physically distinct metal traces 1302, as shown in FIG. 10B. Next, an insulating layer 1309 is deposited to form the device structure shown in FIG. 10C, and subsequently patterned and etched as shown in FIG. 10D.

Figure 10F:
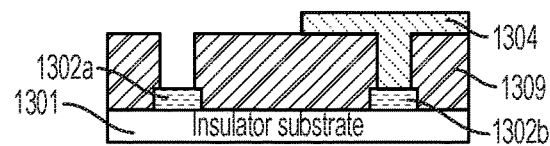
Figure 10G:
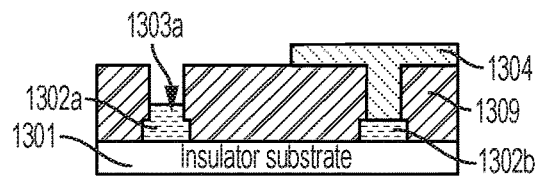
Figure 10H:
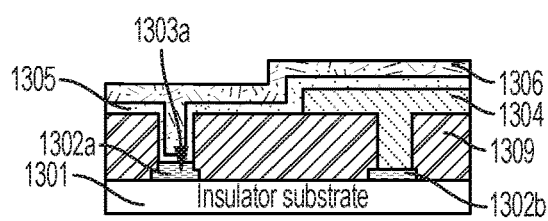

Thereafter, an insulating layer 1304 is deposited, as shown in FIG. 10D, and subsequently patterned and etched to form the device structure shown in FIG. 10F. Next, a first bottom electrode 1303a is selectively deposited on the surface of first metal 1302a, as shown on FIG. 10G. Next, a first solid electrolyte 1305 followed by a first top electrode 1306 are deposited on the device structure of FIG. 10G to form the device structure shown in FIG. 10H.

Figure 10I:
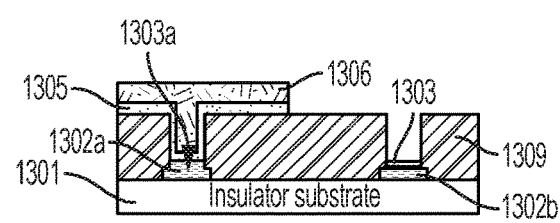
Figure 10J:
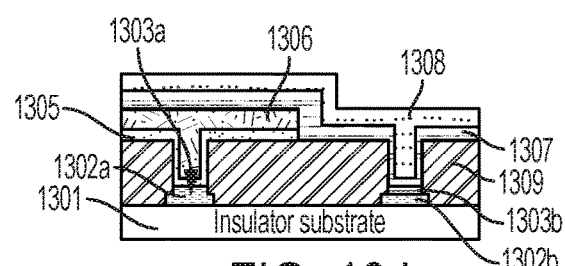
Figure 10K:
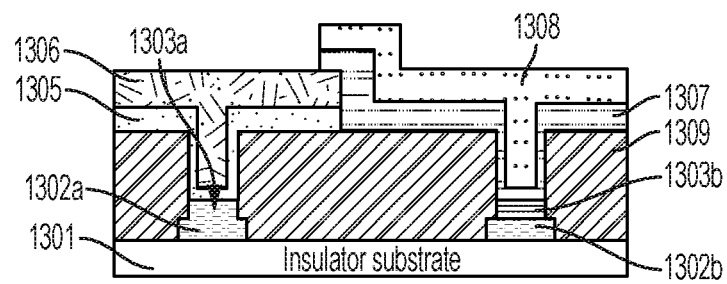
Figure 10L:
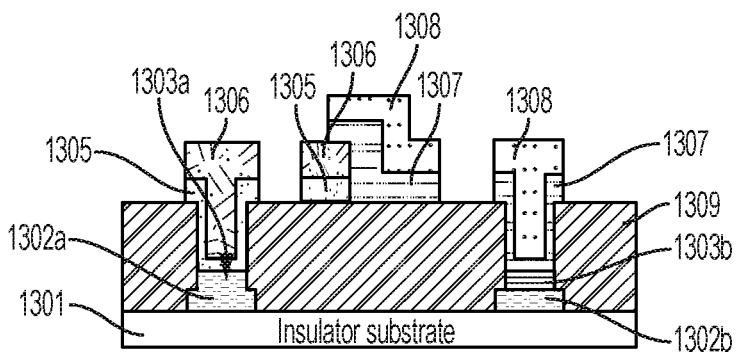

Next, first top electrode 1306, first solid electrolyte 1305, and insulator 1304 are patterned and etched, subsequent to which a second bottom electrode 1303*b* is selectively deposited on the surface of first metal 1302*b* to form the device structure shown in FIG. 10I. Next, a second solid electrolyte 1307 and a second top electrode 1308 are deposited to form the device structure shown in FIG. 10J. Next, second solid electrolyte 1307 and second top electrode 1308 are patterned and etched to form the device structure shown in FIG. 10K. Thereafter, second solid electrolyte 1307, second top electrode 1308, first top electrode 1306, and first solid electrolyte 1305 are patterned and etched to form the device structure shown in FIG. 10L. It is understood that if a metal is used for the bottom electrodes (i.e., the bottom electrodes 1302*a* and 1302*b* are not used) then the processing steps shown in FIGS. 10G, and 10I may be skipped.

Figure 11H:
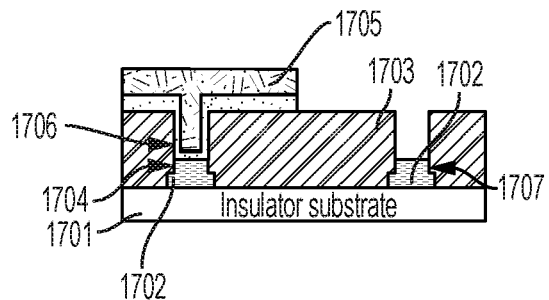

FIGS. 11A-11K show various processing steps for forming a memristor, such as that shown in FIG. 9, and as used, for example, in neural network and the non-volatile memory applications, in accordance with another exemplary embodiment of the present invention. An insulating substrate 1701 is used as the staring material. Thereafter, a first metal layer 1702 is deposited on substrate 1701, as shown in FIG. 11A. First metal layer 1702 is subsequently patterned and etched to form two physically distinct metal traces 1702, as shown in FIG. 11B. Next, an insulating layer 1703 is deposited to form the device structure—as shown in FIG. 10C—and subsequently patterned and etched, as shown in FIG. 11D.

Next, a first bottom electrode 1704 is selectively deposited onto the first metal 1702, as shown in FIG. 11E. Thereafter, a first solid electrolyte layer 1706 and first top electrode layer 1705 are deposited to form the device structure shown in FIG. 11F. The first solid electrolyte layer 1706 and first top electrode layer 1705 are subsequently etched to form the device structure shown in FIG. 11G.

Figure 11I:
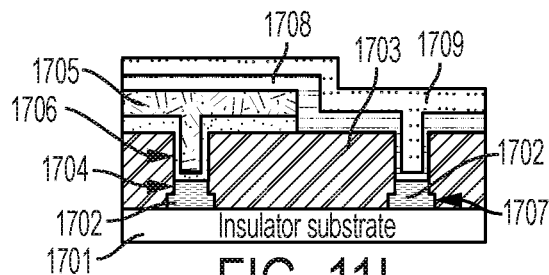
Figure 11J:
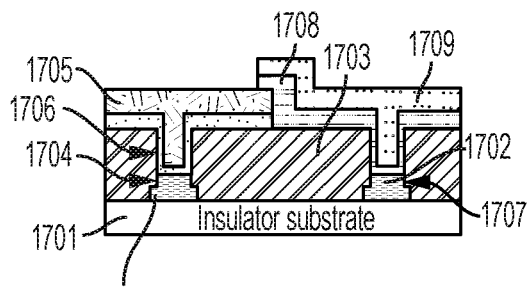
Figure 11K:
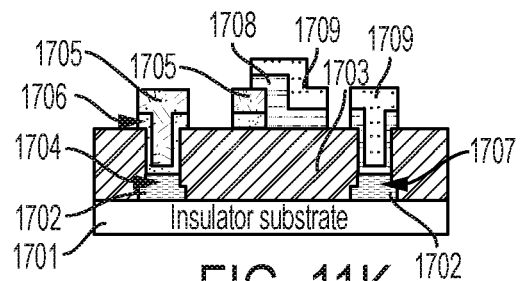

Thereafter, a second bottom electrode 1707 is selectively deposited onto the exposed surface of the first metal 1702 to form the device structure shown in FIG. 11H. Next, a second solid electrolyte layer 1708, and a second top electrode 1709 are deposited, as shown in FIG. 11I, and subsequently patterned and etched to form the device structure shown in FIG. 11J. Thereafter, the first top electrode layer 1705, the second top electrode layer 1709, the first solid electrolyte layer 1706, and the second solid electrolyte 1708 are patterned and etched to form the device structure shown in FIG. 11K. It is understood that if the metal is used as the bottom electrodes thus dispensing the need for bottom electrodes 1702, then the processing steps shown in FIGS. 11E, and 11H may be skipped.

Figure 12:
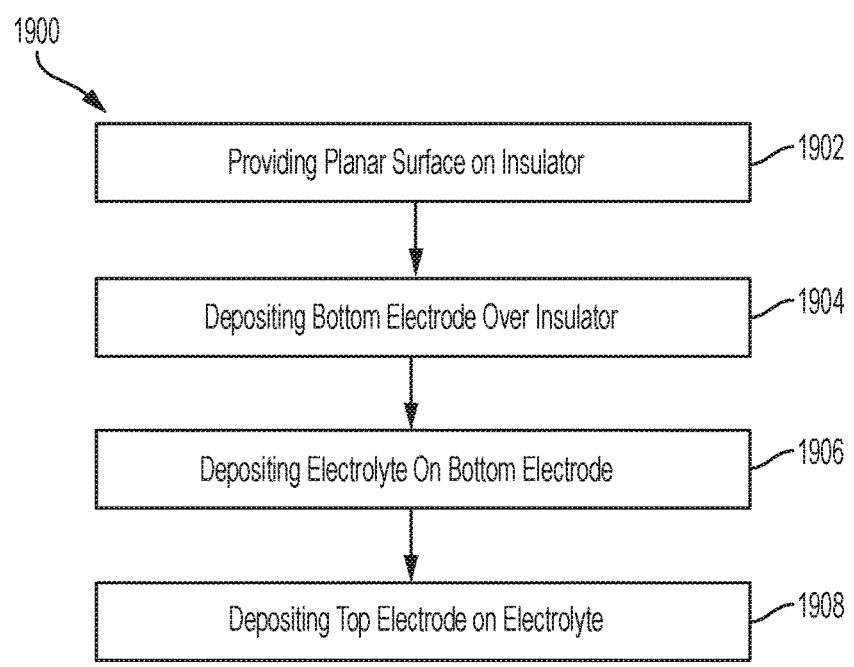
FIG. 12 is a flow chart for manufacturing an integrated circuit system in accordance with one embodiment of the present invention.

FIG. 12 is a flow chart 1900 for manufacturing an integrated circuit system in accordance with one embodiment of the present invention. At 1902 an insulator substrate having a planar surface is provided. At 1904 a bottom electrode is deposited over the insulator substrate. At 1906 an electrolyte is deposited on the bottom electrode. At 1908 a top electrode is deposited on the electrolyte.

Figure 13:
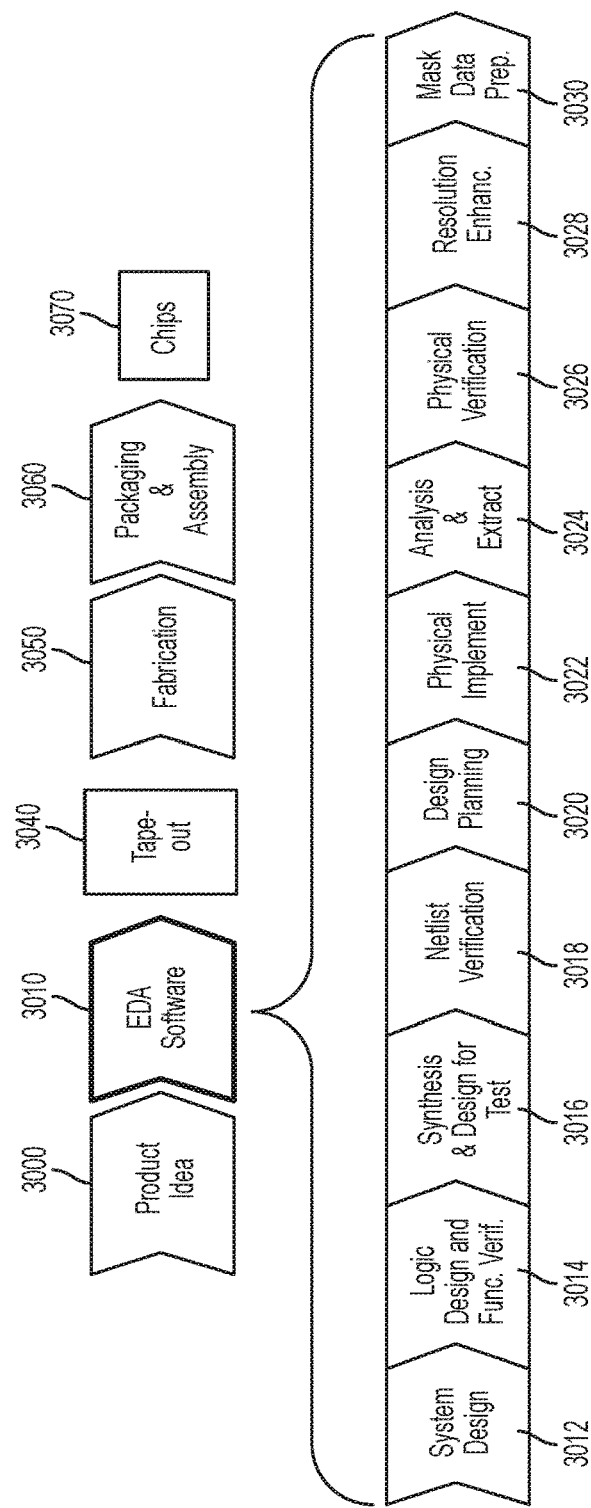
FIG. 13 is a simplified representation of the sequence of steps involved in the design of an integrated circuit that includes a memristor, in accordance with one exemplary embodiment of the present invention.

FIG. 13 shows a simplified representation of an illustrative integrated circuit design flow using any of the memristors described above, in accordance with the embodiments of the present invention. It is understood that many of the steps of FIG. 12 can be combined, performed in parallel or performed in a different sequence without affecting the functions achieved. In some cases a rearrangement of steps will achieve the same results only if certain other changes are made as well, and in other cases a rearrangement of steps will achieve the same results only if certain conditions are satisfied.

At a high level, the process of FIG. 13 starts with the product idea (block 3000) and is realized in an EDA (Electronic Design Automation) software design process (block 3010). When the design is finalized, the fabrication process (block 3050) and packaging and assembly processes (block 3060) occur, ultimately resulting in finished integrated circuit chips (result 3070).

The EDA software design process (block 3010) is actually composed of a number of steps 3012-3030, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit. A brief description of the component steps of the EDA software design process (block 3010) will now be provided.

System design (block 3012): The designers describe the functionality that they want to implement; they can perform what-if planning to refine functionality; check costs; etc. Hardware-software architecture selection can occur at this stage. Example EDA software products that have been available from Synopsys, Inc. that could be used at this step include Model Architect, Saber, System Studio, and DesignWare.RTM. Products.

Logic design and functional verification (block 3014): At this stage, high level description language (HDL) code, such as the VHDL or Verilog code, for modules in the system is written and the design is checked for functional accuracy. More specifically, the design is checked to ensure that it produces the correct outputs in response to particular input stimuli. Example EDA software products that have been available from Synopsys, Inc. that could be used at this step include VCS, VERA, DesignWare.RTM., Magellan, Formality, ESP and LEDA products.

Synthesis and design for test (block 3016): Here, the VHDL/Verilog is translated to a netlist. The netlist can be optimized for the target technology. Additionally, the design and implementation of tests to permit checking of the finished chip occur. Example EDA software products that have been available from Synopsys, Inc. that could be used at this step include Design Compiler.RTM., Physical Compiler, Test Compiler, Power Complier, FPGA Compiler, TetraMAX, and DesignWare.RTM. Products. Optimization of design for use of the memristor and 2d material strip cells as described herein can occur in this stage.

Netlist verification (block 3018): At this step, the netlist is checked for compliance with timing constraints and for correspondence with the VHDL/Verilog source code. Example EDA software products that have been available from Synopsys, Inc. that could be used at this step include Formality, PrimeTime, and VCS products.

Design planning (block 3020): Here, an overall floor plan for the chip is constructed and analyzed for timing and top-level routing. Example EDA software products that have been available from Synopsys, Inc. that could be used at this step include Astro and IC Compiler products. The memristor based cell selection, layout and optimization may occur at this stage.

Physical implementation (block 3022): The placement (positioning of circuit elements) and routing (connection of the same) occurs at this step. Example EDA software products that have been available from Synopsys, Inc. that could be used at this step include AstroRail, Primetime, and Star RC/XT products. memristor based, and/or 2D material strip based, cell layout, mapping and interconnect arrangements can be implemented or optimized at this stage, using for example memristor cells based on memristor cell layouts and structures described herein.

Analysis and extraction (block 3024): At this step, the circuit function is verified at a transistor level; this in turn permits what-if refinement. Example EDA software products that have been available from Synopsys, Inc. that could be used at this stage include Custom Designer, AstroRail, PrimeRail, Primetime, and Star RC/XT products.

Physical verification (block 3026): At this stage various checking functions are performed to ensure correctness for: manufacturing, electrical issues, lithographic issues, and circuitry. Example EDA software products that have been available from Synopsys, Inc. that could be used at this stage include the Hercules product.

Tape-out (block 3040): This stage provides the "tape-out" data for production of masks for lithographic use to produce finished chips. Example EDA software products that have been available from Synopsys, Inc. that could be used at this stage include the CATS.RTM family of products.

Resolution enhancement (block 3028): This stage involves geometric manipulations of the layout to improve manufacturability of the design. Example EDA software products that have been available from Synopsys, Inc. that could be used at this stage include Proteus/Progen, ProteusAF, and PSMGen products.

Mask preparation (block 3030): This stage includes both mask data preparation and the writing of the masks themselves. Example EDA software products that have been available from Synopsys, Inc. that could be used at this stage include CATS.RTM. family of products.

Embodiments of the memristor based technologies described herein can be used during one or more of the above-described stages, including for example one or more of stages 3016 through 3022 and 3030. Also, memristor cell technology provides flexibility that enables the implementation of engineering change orders ECOs, including modification of the cell sizes during design verification stages.

Figure 14A:
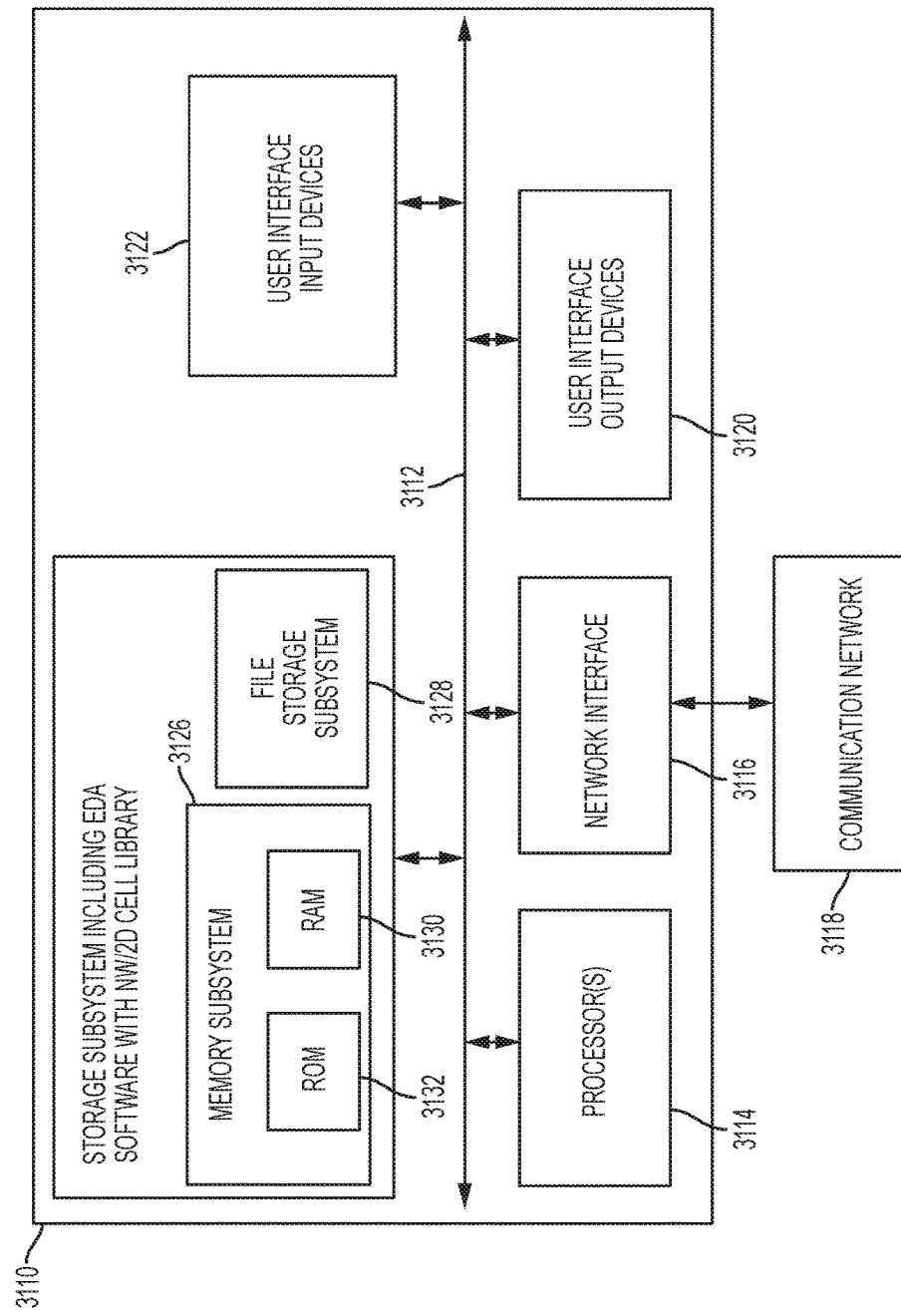
FIGS. 14A-14C are simplified block diagrams of a computer system adapted to operate an electronic design automation (EDA) tool for designing an integrated circuit that includes a memristor, in accordance with one exemplary embodiment of the present invention.
Figures 14B, 14C:
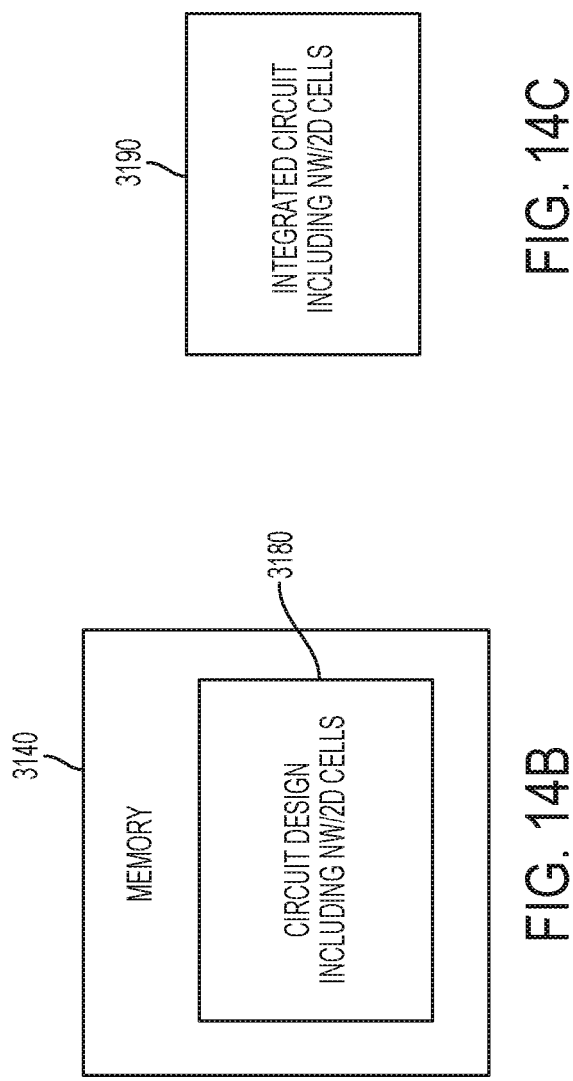

FIGS. 14A, 14B, and 14C are simplified block diagrams of a computer system suitable for use with embodiments of the technology and in using an EDA as shown in FIG. 13, as well as circuit design and circuit embodiments of the technology. Computer system 3110 typically includes at least one processor 3114 which communicates with a number of peripheral devices via bus subsystem 3112. These peripheral devices may include a storage subsystem 3124, comprising a memory subsystem 3126 and a file storage subsystem 3128, user interface input devices 3122, user interface output devices 3120, and a network interface subsystem 3116. The input and output devices allow user interaction with computer system 3110. Network interface subsystem 3116 provides an interface to outside networks, including an interface to communication network 3118, and is coupled via communication network 3118 to corresponding interface devices in other computer systems. Communication network 3118 may comprise many interconnected computer systems and communication links. These communication links may be wireline links, optical links, wireless links, or any other mechanisms for communication of information. While, in one embodiment, communication network 3118 is the Internet, communication network 3118 may be any suitable computer network.

User interface input devices 3122 may include a keyboard, pointing devices such as a mouse, trackball, touchpad, or graphics tablet, a scanner, a touchscreen incorporated into the display, audio input devices such as voice recognition systems, microphones, and other types of input devices. In general, use of the term "input device" is intended to include all possible types of devices and ways to input information into computer system 3110 or onto communication network 3118.

User interface output devices 3120 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computer system 3110 to the user or to another machine or computer system.

Storage subsystem 3124 stores the basic programming and data constructs that provide the functionality of some or all of the EDA tools described herein, including the memristor cell library in which at least one cell specifies a circuit implementation utilizing parallel sets of vertical and/or horizontal memristors and/or 2D material strips as described herein, and tools applied for development of cells for the library and for physical and logical design using the library. These software modules are generally executed by processor 3114.

Memory subsystem 3126 typically includes a number of memories including a main random access memory (RAM) 3130 for storage of instructions and data during program execution and a read only memory (ROM) 3132 in which fixed instructions are stored. File storage subsystem 3128 provides persistent storage for program and data files, and may include a hard disk drive, a floppy disk drive along with associated removable media, a CD-ROM drive, an optical drive, or removable media cartridges. The databases and modules implementing the functionality of certain embodiments may be stored by file storage subsystem 3128.

Bus subsystem 3112 provides a mechanism for letting the various components and subsystems of computer system 3110 communicate with each other as intended. Although bus subsystem 3112 is shown schematically as a single bus, alternative embodiments of the bus subsystem may use multiple busses.

Computer system 3110 itself can be of varying types including a personal computer, a portable computer, a workstation, a computer terminal, a network computer, a television, a mainframe, or any other data processing system or user device. Due to the ever-changing nature of computers and networks, the description of computer system 3110 depicted in FIG. 14A is intended only as a specific example for purposes of illustrating the preferred embodiments. Many other configurations of computer system 3110 are possible having more or less components than the computer system depicted in FIG. 14A.

FIG. 14B shows a memory 3140 such as a non-transitory, computer readable data storage medium associated with file storage subsystem 3128, and/or with network interface subsystem 3116, and can include a data structure specifying a circuit design that includes cells from the memristor, or other memristor cell-based. In other embodiments, the memory 3140 stores a cell library that includes cells implemented using a flexible memristor structure. The memory 3140 can be a hard disk, a floppy disk, a CD-ROM, an optical medium, removable media cartridge, or other medium that stores computer readable data in a volatile or non-volatile form. The memory 3140 is shown storing a circuit design 3180, including for example a description of geometric features of a circuit implementing a cell or macrocell, which includes one or more memristor block cells created with the memristor technology described herein.

FIG. 14C is a block representing an integrated circuit 3190 created with the described technology that includes one or more memristor cells, one or more 2D material strip cells, and/or cells selected from a memristor cell library.

Figure 15:
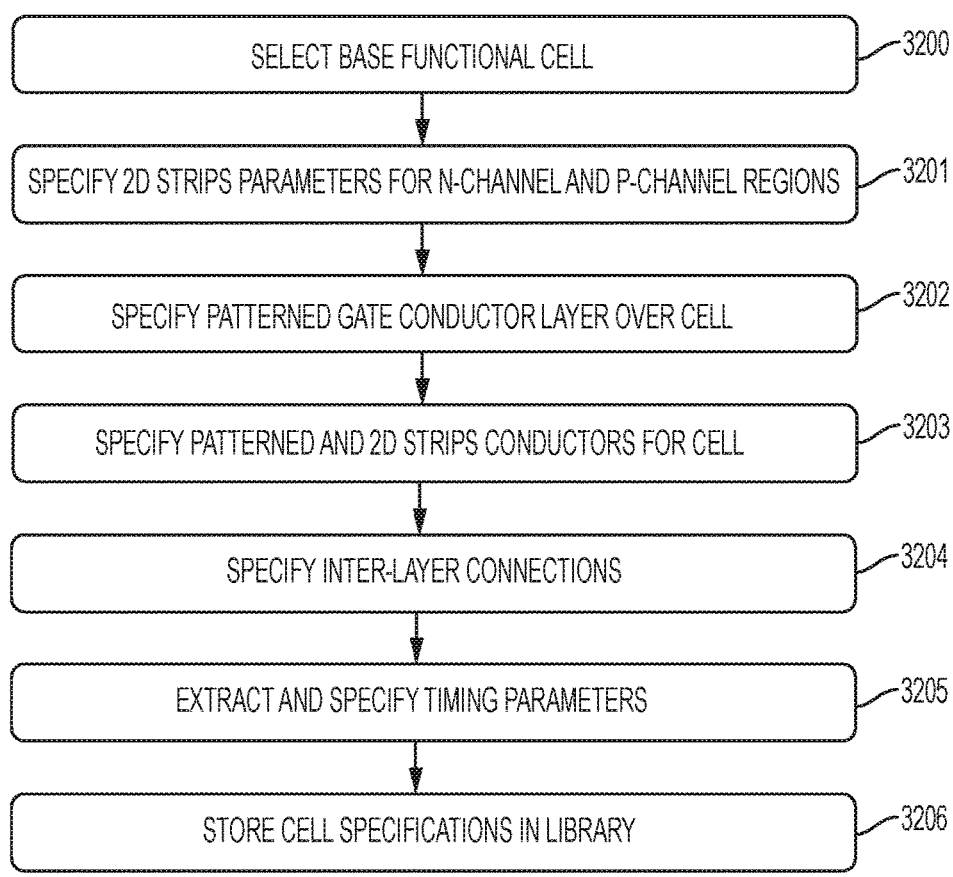
FIG. 15 is a simplified flowchart for designing a memristor or a circuit using an EDA tool, in accordance with one exemplary embodiment of the present invention.

FIG. 15 is a simplified flow diagram of a process for designing a memristor or 2D cell for a cell library. The method may be performed, for example, by an interactive software tool that is used by a cell designer to create a library of cells. The order of the steps can be modified as suits a particular design. According to the simplified flow diagram, a base cell to be included in a cell library is selected (3200). Such a base cell can be an inverter as described above, a flip-flop, logic gates, logic blocks or other cell structures. A base cell in which the number of rows of p-channel memristor, the number of layers of p-channel memristor, the number of rows of n-channel memristor, and the number of layers of n-channel memristor are selectable parameters, within a set of parameters are available according to a target manufacturing process or target manufacturing processes.

In other examples, the user may specify a cell characteristic, such as conductance of the transistors in the on state, or drive ability of the cell. The design tool could use the user specified characteristic to determine cell features including the number of rows and layers of p-channel memristor, and the number of rows and layers of n-channel memristor. User input may specify or provide input used to determine other features, including gate dimensions for example, and features relating to the shape and location of objects in the cell (e.g., cell boundary, location and width of power conductors, gates, active areas) and so on (3201).

The base cell input can comprise a specification of a finFET cell, and the configuration of the fins and the transistors including the fins in the base cell can be utilized to determine the number of rows of p-channel memristor, the number of layers of p-channel memristor, the number of rows of n-channel memristor, and the number of layers of n-channel memristor are selectable parameters, within a set of parameters available according to a target manufacturing process or target manufacturing processes. In this embodiment, the process converts a circuit having a particular transistor having a channel comprising a plurality of fins configured in parallel into a converted circuit, the converted circuit replacing the particular transistor with a converted transistor having a channel comprising a plurality of stacks of memristor arranged in parallel, taking advantage of the granularity of circuit tuning provided by the use of memristor as described herein.

Then, the patterned gate conductor layer is specified to form gates in rows overlying the sets of memristor that will be used for transistors in the cell (3202). Then, the patterned conductor layers are specified, to establish appropriate interconnections, preferably including a layer having conductors arranged in columns, and a layer having conductors arranged in rows (3203). The plurality of patterned conductor layers includes power conductors. Then, the interlayer connections are specified to locate connections among the memristor, the gate conductors, memristor and the conductors, in the one or more patterned conductor layers (3204).

The process of creating the machine readable specifications for an entry in a cell library can include performing extraction processes to define physical characteristics and behaviors of the circuit such as timing parameters like delay, input and output capacitance, gain, area and so on. The extraction processes can be performed using electronic design automation tools like those referred to in connection with FIG. 15 (3205). The specifications produced in this method can comprise layout files implemented in an executable file using Open Architecture System Interchange Standard OASIS format or a Graphic Data System GDS II format file representing the specified geometric shapes of the elements including the memristor. The specifications can include timing files in an executable Liberty Timing File formal (.lib) or in another computer executable format. Entries for a cell library can be created and stored in computer readable memory using the specification, where the entries include the computer readable specifications.

The specified cells are then stored as entries in a cell library for use in integrated circuit design (3206). The specifications in entries in the cell library are executable by a computer running a placement process to control physical placement of the circuit with other circuits or components.

As such, a machine readable specification of a circuit in the context of this description includes a functional configuration of the elements, such as hierarchical configurations, and configurations matching application programmer interfaces (APIs), necessary for execution by the tools for mapping cells from netlists, tools for placement and routing, tools for optimization and/or other tools involved in the production of an integrated circuits and integrated circuit designs utilizing the circuits.

The process may be repeated to define a large number of circuits used as building blocks in integrated circuits. The specifications of the circuits can be used to generate a cell library that includes a large number of cells implementing different functions and performance specifications. In addition, a cell library can be implemented in which a plurality of entries specify implementations of a common circuit configuration, such as a NAND gate circuit. Each of the entries specifying a common NAND gate circuit using memristor can differ in the number of memristor used for a particular transistor or used for a particular interconnect. For example, the particular transistor used in the NAND gate circuit can have a set of nine memristor in one entry in the cell library, and have a set of memristor in another entry in the cell library.

Figure 16:
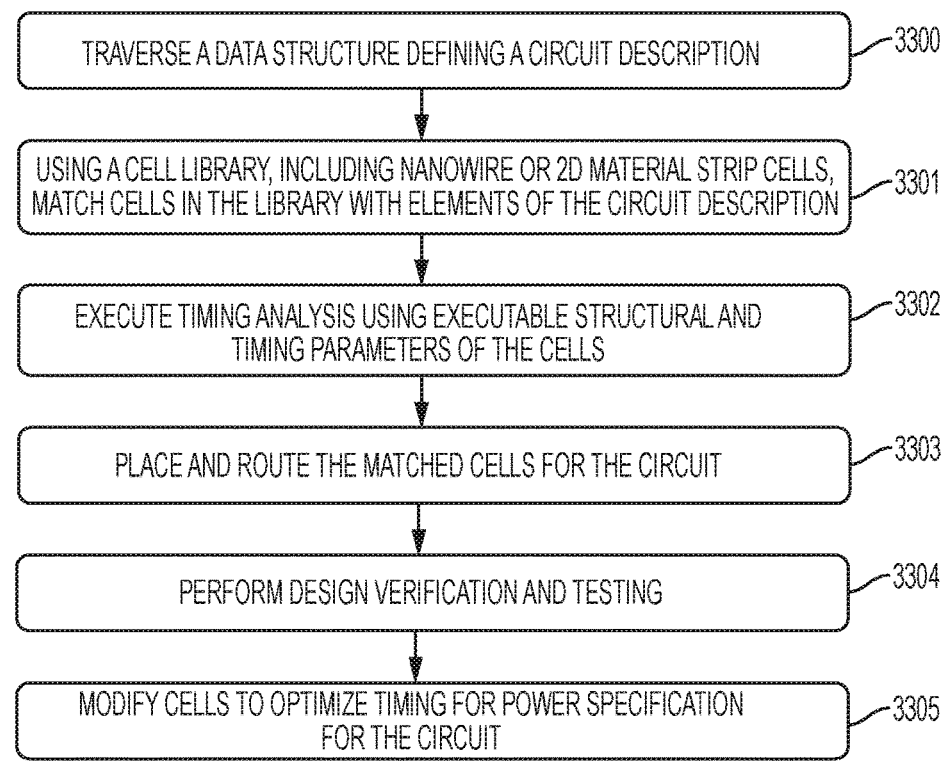
FIG. 16 illustrates an exemplary representative design automation process that can be implemented as logic executed by a system like that shown in FIGS. 14A-14C.

FIG. 16 is a flowchart for a representative design automation process which can be implemented as logic executed by a system like that represented by FIGS. 14A, 21B, and 21C, including a memristor library having cells implemented using at least one memristor cell as described herein. According to a first step of the process, a data structure that defines a circuit description, such as a netlist, is traversed in a data processing system (3300). A cell library stored in a database or other computer readable medium coupled with the data processing system, that includes memristor, as described herein, is accessed by the data processing system, and utilized to match cells in the library with the elements of the circuit description (3301). Timing analysis can be performed using the executable structural and timing specifications in the cell library, based on other components and circuits, and based on estimates about the other components and circuits. (3302). The matched cells are then placed and routed for an integrated circuit layout (3303). Next, design verification and testing is executed (3304). Finally, memristor cells can be modified to optimize timing or power specifications for the circuit (3305). The modifications of the memristor can comprise mask changes that result in changes to the conductors in the patterned conductor layers, and in the pattern of interlayer connectors, to change the number of memristor utilized. These changes can be accomplished in some instances without changing the area on the integrated circuit occupied by the cell. These and other valuable aspects of the present invention consequently further the state of the technology to at least the next level.

The above embodiments of the present invention are illustrative and not limitative. Embodiments of the present invention are not limited by the type of deposition, patterning, etching, and other semiconductor processing steps required to form the various layers and structures described herein. Embodiments of the present invention are not limited to any specific thicknesses of the layers described herein. Embodiments of the present invention are not limited to the materials/layers described above. Accordingly, it is understood that other semiconductor materials may be present between the various layers described above.

Furthermore, it is understood that an upper solid electrolyte may be a single layer or include combination of layers with different materials, different implant types, different implant concentrations of the same type, or a combination thereof. It is understood that the first and second solid electrolytes may be different materials. It is further understood that the first and second solid electrolytes may the same material with different thicknesses, different dopants and/or doping concentrations.

It is further understood that an upper electrode may be a single layer or include a combination of layers with different materials. The first and second top electrodes may be formed from different materials, or may be formed from the same material with different thicknesses, different dopants and/or doping concentrations. It is further understood that the first bottom electrode and second bottom electrode may be formed from different materials, or may be formed from the same material with different thicknesses, different dopants and/or doping concentrations.

It is further understood that in some embodiments different materials of a memristor may be integrated on one die using the same planar surface. In other embodiments, different materials of a memristor may be integrated on the same plane.

It is understood that some processing steps, in accordance with the present invention, include using low resolution mask steps to define different materials on different areas, such as those shown in FIGS. 5A-5F, whereas other processing steps include using high resolution masking steps, such as those shown in FIGS. 5G-5H or FIG. 5M. Other additions, subtractions or modifications are obvious in view of the present disclosure and are intended to fall within the scope of the appended claims.

What is claimed is:

1. A method of manufacturing an integrated circuit system, the method comprising:
    providing a planar surface on an insulator substrate;
    forming first and second bottom electrodes over the insulator substrate;
    forming a first electrolyte over the first and second bottom electrodes;
    forming a first top electrode over the first electrolyte;
    patterning and removing the first top electrode and the first electrolyte from regions above the second bottom electrode;
    forming a second electrolyte above the second bottom electrode;
    forming a second top electrode above the second electrolyte; and
    patterning and removing the second top electrode and the second electrolyte from regions above the first bottom electrode.

2. The method of claim 1 wherein the insulator is one of oxide or nitride.

3. The method of claim 1 wherein the first electrolyte is different from the second electrolyte.

4. The method of claim 1 wherein the first electrolyte has a thickness that is different from a thickness of the second electrolyte.

5. The method of claim 1 wherein the first electrolyte is doped with a first dopant different than a second dopant doping the second electrolyte.

6. The method of claim 1 wherein said first and second electrolytes have different doping concentrations.

7. The method of claim 1 wherein said first top electrode is formed using a first material and said second top electrode is formed using a second material different from the first material.

8. The method of claim 1 wherein the first top electrode includes a plurality of layers formed from different materials.

9. The method of claim 1 wherein said first and second top electrodes have different thicknesses.

10. The method of claim 1 wherein said first bottom electrode is formed using a first material and said second bottom electrode is formed using a second material different from the first material.

11. The method of claim 1 wherein said first and second top electrodes are doped with different dopants.

12. The method of claim 1 wherein said first and second top electrodes have different doping concentrations.

13. The method of claim 1 wherein said first and second bottom electrodes are doped with different dopants.

14. The method of claim 1 wherein said first and second top electrodes have different doping concentrations.

15. The method of claim 1 wherein said first and second top electrodes have different thicknesses.

16. The method of claim 1 wherein said first and second bottom electrodes have different thicknesses.

17. The method of claim 1 wherein said first electrolyte includes a first doped region and a second undoped region.

18. The method of claim 1 wherein said second electrolyte includes a first doped region and a second undoped region.

* * * * *